United States Patent
Muza

(10) Patent No.: US 6,822,509 B2
(45) Date of Patent: Nov. 23, 2004

(54) DIFFERENTIAL CIRCUIT WITH A LINEARITY CORRECTION LOOP

(75) Inventor: John M. Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 10/370,396

(22) Filed: Feb. 20, 2003

(65) Prior Publication Data

US 2004/0164793 A1 Aug. 26, 2004

(51) Int. Cl.[7] ................................................. H03F 3/45
(52) U.S. Cl. ............................................. 330/9; 330/69
(58) Field of Search ................................ 330/9, 69, 85, 330/98, 99, 100, 149

(56) References Cited

U.S. PATENT DOCUMENTS 6,121,831 A * 9/2000 Mack ............................ 330/9

* cited by examiner

Primary Examiner—Steven J. Mottola
(74) Attorney, Agent, or Firm—Alan K. Stewart; W. James Brady, III; Frederick J. Telecky, Jr.

(57) ABSTRACT

A differential circuit with linearity correction loop includes a main differential amplifier 30, and a correction amplifier 20 having inputs coupled to the outputs of the main differential amplifier 30 through feedback paths. The output signals from the correction amplifier 20 are combined with the inputs to the main amplifier 30 such that a negative feedback loop is formed around the differential circuit. This feedback loop provides stability with only a minor power increase.

12 Claims, 1 Drawing Sheet

DIFFERENTIAL CIRCUIT WITH A LINEARITY CORRECTION LOOP

FIELD OF THE INVENTION

This invention generally relates to electronic systems and in particular it relates to differential amplifier circuits.

BACKGROUND OF THE INVENTION

The main distortion source in a power amplifier lies in the output stage. As it supplies the large current variations that the load usually requires, the amplifier open loop gain changes considerably. The main key is the gain of the second stage where the second stage is the output stage. In general feedback theory, as the negative feedback gain that loops around the distortion source increases, the total harmonic distortion (THD) will be reduced by 1+T(w) where T(w) is the loop gain at harmonic frequencies 2w, 3w, etc. Each negative feedback loop around the distortion source has a multiplicative reduction effect.

In a power efficient class AB output stage the current is throttled back as low as possible to save power. In a typical two stage design this implies the second stage gain is severely reduced in a quiescent state and in power conscience designs the second stage gain is typical less than one, and in some cases, when driving very low impedance loads, such as load speakers, the gain can be much less than one. This means there is really only one gain loop around the error source rather than two at low signal levels. The low level linearity (actually in a classical two stage class AB design the entire signal range) is severely impaired by driving small impedance loads.

There are many prior art types of multi-stage amps. These are good for THD because of the multi-loops around the output stage. These provide a multiplication reduction by the loop gains for the closed loop THD of the amp. In a three stage amplifier, even though the last stage gain would be impaired, there are still two gain loops rather than one in the previous case. The major drawback of these prior art designs is the amount of power required to keep stability. When a small impedance load is added to the circuit, since the third stage gain is much less than one in a class AB design, the pole associated with the second stage moves down in frequency. Therefore, to compensate this amplifier, the circuit would either have to pump a high quiescent current to boost the transconductance of the third stage of the amplifier to higher levels, or use a high current to boost the transconductance of the second stage of the amplifier to higher levels. This means that two of the three stages have to be power hungry stages. This is not the answer for low idle current applications when driving low impedance loads (50 ohms or less in standard CMOS). Bipolar amplifiers handle this problem better since they have higher transconductance-to-current ratios than MOS, but the concept of the problem remains.

A system feedback loop method with low current and improved distortion performance is disclosed in U.S. Pat. No. 6,275,102 "Distortion Correction Loop for Amplifier Circuits" granted on Aug. 14, 2001. It is based on single-ended, or pseudo-differential structures that accept a differential signal, but the output is single-ended. Duplicating these structures for the opposite phase gives the "pseudo" differential device, but it is not a true fully differential circuit.

SUMMARY OF THE INVENTION

The differential circuit with linearity correction loop includes a main differential amplifier, and a correction amplifier having inputs coupled to the outputs of the main differential amplifier through feedback paths. The output signals from the correction amplifier are combined with the inputs to the main amplifier such that a negative feedback loop is formed around the differential circuit. This feedback loop provides stability with only a minor power increase.

DETAILED DESCRIPTION OF PREFERRED EMBODIMENTS

Figure 1:
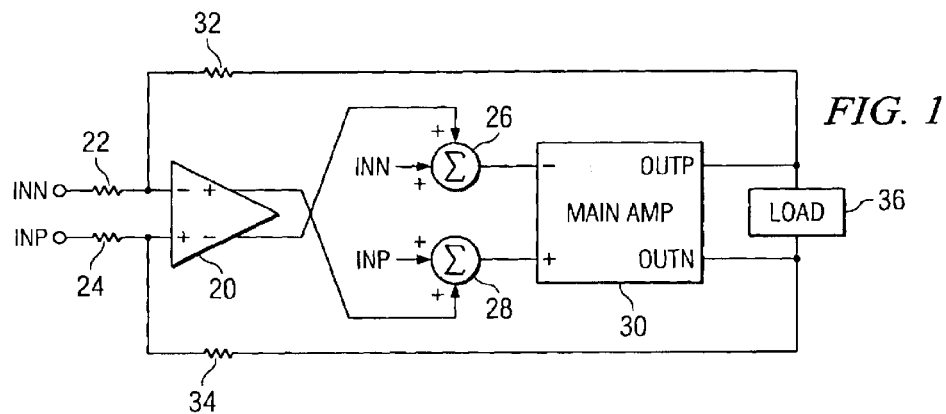
FIG. 1 is a schematic circuit diagram of a preferred embodiment differential circuit with linearity correction loop.

A preferred embodiment differential circuit with a linearity correction loop is shown in FIG. 1. The circuit of FIG. 1 includes correction amplifier 20; input resistors 22 and 24; summing nodes 26 and 28; main amplifier 30; feedback resistors 32 and 34; load 36; input nodes INP and INN; and output nodes OUTP and OUTN. This circuit provides multiple-feedback loop distortion performance at very low additional current over a simple two-stage amplifier.

Typically more negative feedback loops around the main distortion source (in power amplifiers it's the output stage) makes things better. Totally internally generated multi-stage amplifiers pay a power penalty because of the complicated compensation techniques necessary to maintain stability. The preferred embodiment, shown in FIG. 1, provides the benefit, but without this power penalty.

Figure 2:
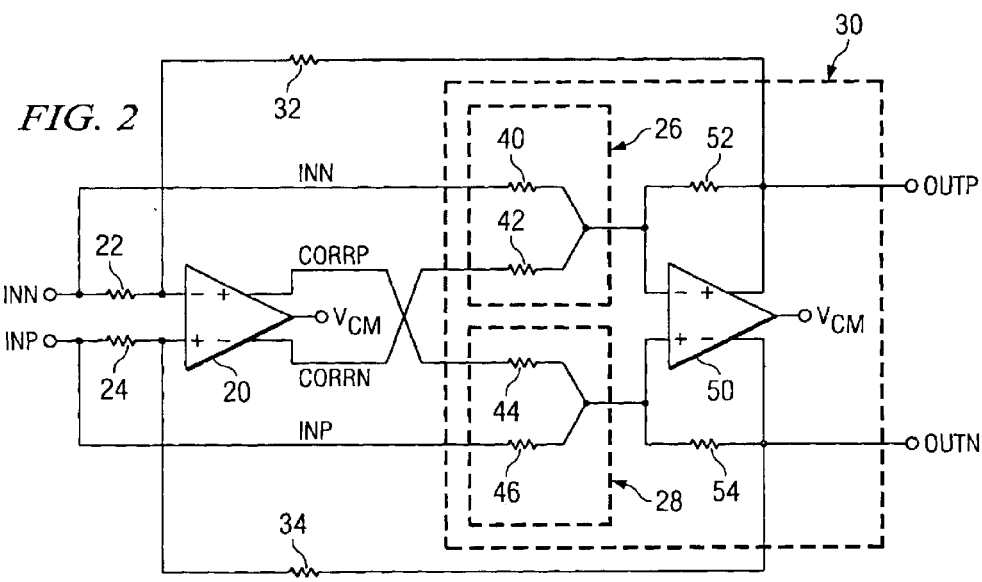
FIG. 2 is a schematic circuit diagram of a detailed example of the circuit of FIG. 1.

A more detailed example of the circuit of FIG. 1 is shown in FIG. 2. The circuit of FIG. 2 includes correction amplifier 20; input resistors 22 and 24; summing node 26 which includes resistors 40 and 42; summing node 28 which includes resistors 44 and 46; main amplifier 30 which includes amplifier 50 and resistors 52 and 54; feedback resistors 32 and 34; input nodes INP and INN; correction amplifier output nodes CORRP and CORRN; output nodes OUTP and OUTN; and common mode voltage Vcm.

The correction signals CORRN and CORRP modulate around common mode signal $V_{CM}$. If main amp 30 has zero error then nodes CORRN and CORRP will sit at common mode voltage $V_{CM}$. They will move based on how much error the main amp 30 generates as compared with INP minus INN. This circuit generates an improvement of approximately 30 dB to 40 dB in THD at the expense of six resistors 22, 24, 32, 34, 42, and 44, and one correction amplifier 20, which due to its significantly lighter loading can be very low power. In the example of audio circuits for wireless handsets this additional current can only be 50 $\mu$A–100 $\mu$A to yield this 30–40 dB improvement. With the preferred embodiment circuit, 50 $\mu$A will provide about 37 dB THD improvement for an 8Ω (load) driver.

The low current solution is obtained because the correction loop is a system loop, which differs from classical multiple-loop amplifiers. All feedback loops must be stable using superposition theorem. If you break the loop around feedback resistor 32 or 34 and do a stability analysis, the poles and zeros of the main amplifier 30 are in the closed loop position with respect to the outer correction loop. The AC gain response of the main amplifier system is that of a two pole amplifier. The bandwidth is one half the main amplifier's true unity gain bandwidth due to choice of inverting gain of zero db in the main amplifier 30.

Figure 3:
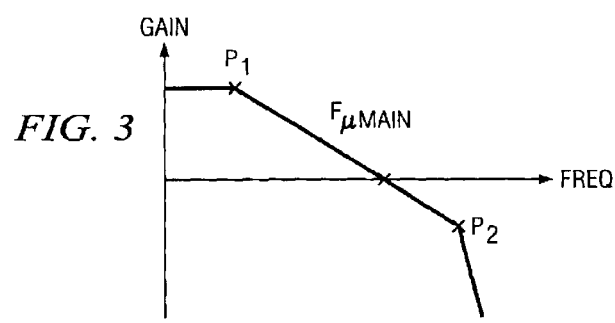
FIG. 3 is a plot of the gain for the main amplifier in the circuit of FIG. 1 and FIG. 2.

Now the correction loop amplifier open loop poles/zeros are combined with the closed loop response of the main amplifier to determine the stability. A generic, graphical example is used to illustrate the stability criteria and show the trade-off against performance. More bandwidth of the correction loop provides higher performance, but less stability. Assume main amplifier 30 is a simple 2 pole system and the correction amp is a 1 pole operational transconductance amplifier (OTA) that is a single gain stage amplifier. FIG. 3 is a plot of the gain for a good phase margin (rule of thumb) design for the main amplifier 30 where the second pole $p_2$ is equal to four times the unity gain bandwidth $f_{\mu main}$. The first pole $P_1$ is also shown in FIG. 3. In closed loop, the first closed loop pole $P_{1clmain}$ is approximately $f_{\mu main/2}$ (unity gain configuration). Since this pole $P_{1clmain}$ will be the second main pole for the correction loop path, the correction loop unity gain bandwidth is chosen as $$f_{\mu corrloop} = \frac{f_{\mu main/2}}{4}.$$

In this case the correction loop is also in an inverting gain of 0 dB for the closed loop, so a factor of 2 is gained. A basic stability criteria if these amps were this simple would be $$f_{\mu mainamp} \geq 4 * f_{\mu corramp}$$

where $f_{\mu mainamp}$ is the unity gain bandwidth of the main amplifier 30 and $f_{\mu corramp}$ is the unity gain bandwidth of the correction amplifier 20.

Forgetting the factor of 2, and assuming the frequency of interest lies on the gain-bandwidth curve, the amount of improvement is proportional to the main amplifier bandwidth. In this case there is approximately 20 log($f_{\mu main}$/(4 frequency of interest))dB improvement over standard case without the correction loop. For example, if the bandwidth of the main amplifier 30 is 4 MHz and the frequency of interest is 9 KHz (third harmonic of a 3 KHz voice band signal), the improvement is approximately 40 db. If the bandwidth of the main amplifier is 8 MHz, the improvement is approximately 46 db.

In essence, what is achieved with the preferred embodiments of FIGS. 1 and 2 is a negative feedback loop around the output stage with a gain of $A_1 * A_2$, where $A_1$ is the gain of main amplifier 30 and $A_2$ is the gain of loop amplifier 20. The extra feedback loop provides stability with only a minor power increase. This is an important improvement over the prior art multi-stage solutions because the prior art solutions significantly increase the power consumption. Any time negative feedback loops are added, the overall stability is still an issue, but for the circuits of FIGS. 1 and 2, the only thing required is that the bandwidth through the loop amplifier 20 be kept a few factors less than the main path.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A differential circuit with a linearity correction loop comprising:

a main differential amplifier;

a correction amplifier having a first input coupled to a first output of the main differential amplifier and to a first input node, and a second input coupled to a second output of the main differential amplifier and to a second input node;

a first summing node having a first input coupled to the first input node, a second input coupled to a first output of the correction amplifier, and an output coupled to a first input of the main differential amplifier;

a second summing node having a first input coupled to the second input node, a second input coupled to a second output of the correction amplifier, and an output coupled to a second input of the main differential amplifier; and wherein the first summing node comprises a first resistor coupled between the first input of the first summing node and the output of the first summing node, and a second resistor coupled between the second input of the first summing node and the output of the first summing node.

2. The circuit of claim 1 further comprising:

a first feedback resistor coupled between the first input of the correction amplifier and the first output of the main differential amplifier; and a second feedback resistor coupled between the second input of the correction amplifier and the second output of the main differential amplifier.

3. The circuit of claim 1 wherein the second summing node comprises a third resistor coupled between the first input of the second summing node and the output of the second summing node, and a fourth resistor coupled between the second input of the second summing node and the output of the second summing node.

4. The circuit of claim 1 wherein the first input of the main differential amplifier is a negative input, the second input of the main differential amplifier is a positive input, the first output of the main differential amplifier is a positive output, the second output of the main differential amplifier is a negative output, the first input of the correction amplifier is a negative input, the second input of the correction amplifier is a positive input, the first output of the correction amplifier is a negative output, and the second output of the correction amplifier is a positive output.

5. The circuit of claim 1 further comprising:

a third resistor coupled between the first input node and the first input of the correction amplifier; and a fourth resistor coupled between the second input node and the second input of the correction amplifier.

6. A differential circuit with a linearity correction loop comprising:

a main differential amplifier;

a correction amplifier having a first input coupled to a first output of the main differential amplifier and to a first input node, and a second input coupled to a second output of the main differential amplifier and to a second input nodes;

a first summing node having a first input coupled to the first input node, a second input coupled to a first output of the correction amplifier, and an output coupled to a first input of the main differential amplifier;

a second summing node having a first input coupled to the second input node, a second input coupled to a second output of the correction amplifier, and an output coupled to a second input of the main differential amplifier;

wherein the main differential amplifier comprises:
a fully differential amplifier;
a first resistor coupled between a positive output of the fully differential amplifier and a negative input of the fully differential amplifier; and
a second resistor coupled between a negative output of the fully differential amplifier and a positive input of the fully differential amplifier.

7. A differential circuit with a linearity correction loop comprising:
a main differential amplifier;
a first feed back device coupled to a first output of the main differential amplifier;
a second feed back device coupled to a second output of the main differential amplifier;
a correction amplifier having a first input coupled to the first feed back device and to a first input node, and a second input coupled to the second feed back device and to a second input node;
a first summing node having a first input coupled to the first input node, a second input coupled to a first output of the correction amplifier, and an output coupled to a first input of the main differential amplifier;
a second summing node having a first input coupled to the second input node, a second input coupled to a second output of the correction amplifier, and an output coupled to a second input of the main differential amplifier; and
wherein the first summing node comprises a first resistor coupled between the first input of the first summing node and the output of the first summing node, and a second resistor coupled between the second input of the first summing node and the output of the first summing node.

8. The circuit of claim 7 wherein the first feedback device is a first feedback resistor and the second feedback device is a second feedback resistor.

9. The circuit of claim 7 wherein the second summing node comprises a third resistor coupled between the first input of the second summing node and the output of the second summing node, and a fourth resistor coupled between the second input of the second summing node and the output of the second summing node.

10. The circuit of claim 7 wherein the first input of the main differential amplifier is a negative input, the second input of the main differential amplifier is a positive input, the first output of the main differential amplifier is a positive output, the second output of the main differential amplifier is a negative output, the first input of the correction amplifier is a negative input, the second input of the correction amplifier is a positive input, the first output of the correction amplifier is a negative output, and the second output of the correction amplifier is a positive output.

11. The circuit of claim 7 further comprising:
a third resistor coupled between the first input node and the first input of the correction amplifier; and
a fourth resistor coupled between the second input node and the second input of the correction amplifier.

12. The circuit of claim 7 wherein the main differential amplifier comprises:
a fully differential amplifier;
a third resistor coupled between a positive output of the fully differential amplifier and a negative input of the fully differential amplifier; and
a fourth resistor coupled between a negative output of the fully differential amplifier and a positive input of the fully differential amplifier.

* * * * *